United States Patent [19]
Gans

[11] 4,388,626
[45] Jun. 14, 1983

[54] PHASED ARRAY ANTENNAS USING FREQUENCY MULTIPLICATION FOR REDUCED NUMBERS OF PHASE SHIFTERS

[75] Inventor: Michael J. Gans, Monmouth Beach, N.J.

[73] Assignee: Bell Telephone Laboratories, Incorporated, Murray Hill, N.J.

[21] Appl. No.: 240,765

[22] Filed: Mar. 5, 1981

[51] Int. Cl.³ ............................................. H01Q 3/46
[52] U.S. Cl. .............................. 343/854; 343/100 SA
[58] Field of Search ................ 343/100 ST, 100 SA, 343/754, 779, 854

[56] References Cited
U.S. PATENT DOCUMENTS 3,576,579 4/1971 Appelbaum et al. ................ 343/778
3,631,503 12/1971 Tang et al. ........................... 343/754
3,835,469 9/1974 Chen et al. ........................... 343/754

*Primary Examiner*—Eli Lieberman
*Attorney, Agent, or Firm*—Erwin W. Pfeifle

[57] ABSTRACT

The present invention relates to a phased array antenna system which, in the transmission mode, forms a directional planar wavefront (20) including a signal at a first frequency at a first array ($18_1$–$18_m$) which is a sub-multiple of the frequency to be ultimately transmitted. By sending the wavefront through a lens or reflector, an image of the first array is formed on an image plane. A second array ($26_1$–$26_n$) disposed at the image plane intercepts the wavefront and the received signal's frequency and phase is then harmonically multiplied by a predetermined number to permit reradiation of the resultant signal by a third array ($32_1$–$32_n$) in the same direction as the original wavefront. The second and third arrays include corresponding elements and configurations with more elements than the first array. In the receive mode, the sequence is complementary to the transmit mode.

6 Claims, 3 Drawing Figures

PHASED ARRAY ANTENNAS USING FREQUENCY MULTIPLICATION FOR REDUCED NUMBERS OF PHASE SHIFTERS

BACKGROUND OF THE INVENTION

1. Field of the Invention

The present invention relates to phased array antenna arrangements which use frequency multiplication to reduce the number of required phase shifters and, more particularly, to phased array antenna arrangements which launch a desired directional wavefront at a much lower frequency than desired using only the number of feed elements and associated phase shifters needed to launch such low frequency beams in a predetermined direction, and then separately harmonically upconverting and amplifying, if necessary, the low frequency beam signals found at an image plane of the low frequency beam launching array, with the originally generated phase shifts, to the actual transmission frequency and level for launching in the desired directional output beam.

2. Description of the Prior Art

In order to prevent grating lobes from appearing in the field of view of a phased array antenna, the phased array must have N x M elements, where N is approximately the number of beamwidths in the field of view in one plane and M is that in the orthogonal plane. Each of these elements requires a phase shifter which must be individually adjusted to aim the phased array antenna beam anywhere in the field of view. Conventional arrays of this type generally require a large number of phase shifters which may be inappropriate in certain applications as, for example, a satellite scanning beam phased array antenna where factors of complexity, weight, maintenance, aperture size and range of scanability are important factors.

U.S. Pat. No. 3,576,579 issued to A. J. Appelbaum et al on Apr. 27, 1971 attempts to overcome certain of the above-stated factors by providing a planar radial array with a controllable quasi-optical lens which includes a radial line power-dividing means. In accordance with the Appelbaum et al patent, a power feed apparatus is provided which includes a power-dividing means and a power-distributing means. The power-dividing means includes an input port and n output ports and is operative to receive an input signal of a predetermined power level at the input port and to divide the input signal into n output signals of reduced power level at the n output ports. The power-distributing means is operative to receive the n output signals from the n output ports of the power-dividing means and to provide m output signals of varying power levels at m output connections. When the above-described power-dividing and power-distributing apparatus is employed in a power feed apparatus for a phased-array antenna system, the m output signals of varying power levels are used to establish the required power levels for the antenna elements of the array whereby a desired beam taper illumination function is achieved across the aperture defined by the array of antenna elements. The Appelbaum et al arrangement, however, still requires a reasonably large number of feed elements and associated phase shifters.

U.S. Pat. No. 3,835,469 issued to C. C. Chen et al on Sept. 10, 1974 relates to an optical limited scan antenna system including an aperture lens, a feed lens and a feed array for scanning a pencil beam or multiple simultaneous beams over a limited angular sector with good sidelobe levels and minimum gain degradation. Both amplitude and phase distributions over the aperture lens are controlled for all scan angles. In accordance with the Chen et al arrangement, an aperture lens that is large in diameter compared with that of a feed lens is placed in confocal relationship therewith. Both the aperture and feed lens are entirely passive and are focused by means of fixed phase shifters or line lengths in the elements. A small phased array or other source is used to illuminate a portion of the feed lens with a plane wave segment. This wave passes through the feed lens, converges near the broadside focus at the focal plane, then spreads out again and is intercepted by the aperture lens which refocuses the energy to infinity. By changing the angle of the plane wave emanating from the small feed antenna, the beam is scanned in the far field.

U.S. Pat. No. 3,631,503 issued to R. Tang et al on Dec. 28, 1971 relates to a high performance distributionally integrated subarray antenna which consists of a feed-through lens with a high-performance feed system. The Tang et al arrangement employs the technique of resolving the radiating array of the feed-through lens into subarrays which overlap each other completely over the entire radiating aperture. Each of the subarrays has a truncated sinx/x amplitude distribution across the entire radiating aperture where x is linear distance therealong, thus producing a radiation pattern closely rectangular in shape. The rectangular subarray pattern is stated as being ideal, since it maximizes the array gain and minimizes the grating lobe level for a given system bandwidth. Therefore, this overlapping subarray technique supposedly allows the antenna to perform over a wide instantaneous bandwidth with a minimum number of subarrays or time delay phase shifters. Use of this technique also supposedly tends to minimize cost, since the cost of such a system is reflected in the number of subarrays required. This arrangement, however, requires a reasonably large number of feed elements and associated phase shifters in the feed-through lens to provide adequate scanning capabilities and correcting for the spherical aberration of the lens.

The problem remaining in the prior art is to provide a phased array antenna arrangement which provides wide field of view scanning with reduced numbers of feed elements and associated phase shifters than normally used with conventional phased array antennas having comparable capabilities.

SUMMARY OF THE INVENTION

The foregoing problems have been solved in accordance with the present invention which relates to phased array antenna arrangements which use frequency multiplication to reduce the number of required phase shifters and, more particularly, to phased array antenna arrangements which launch a desired directional wavefront at a much lower frequency than desired using only the number of feed elements and associated phase shifters needed to launch such low frequency beams in a predetermined direction, and then separately harmonically upconverting and amplifying, if necessary, the low frequency beam signals formed at an image plane of the low frequency beam launching array, with the originally generated phase shifts, to the actual transmission frequency and level for launching in the desired directional output beam.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

Figure 1:
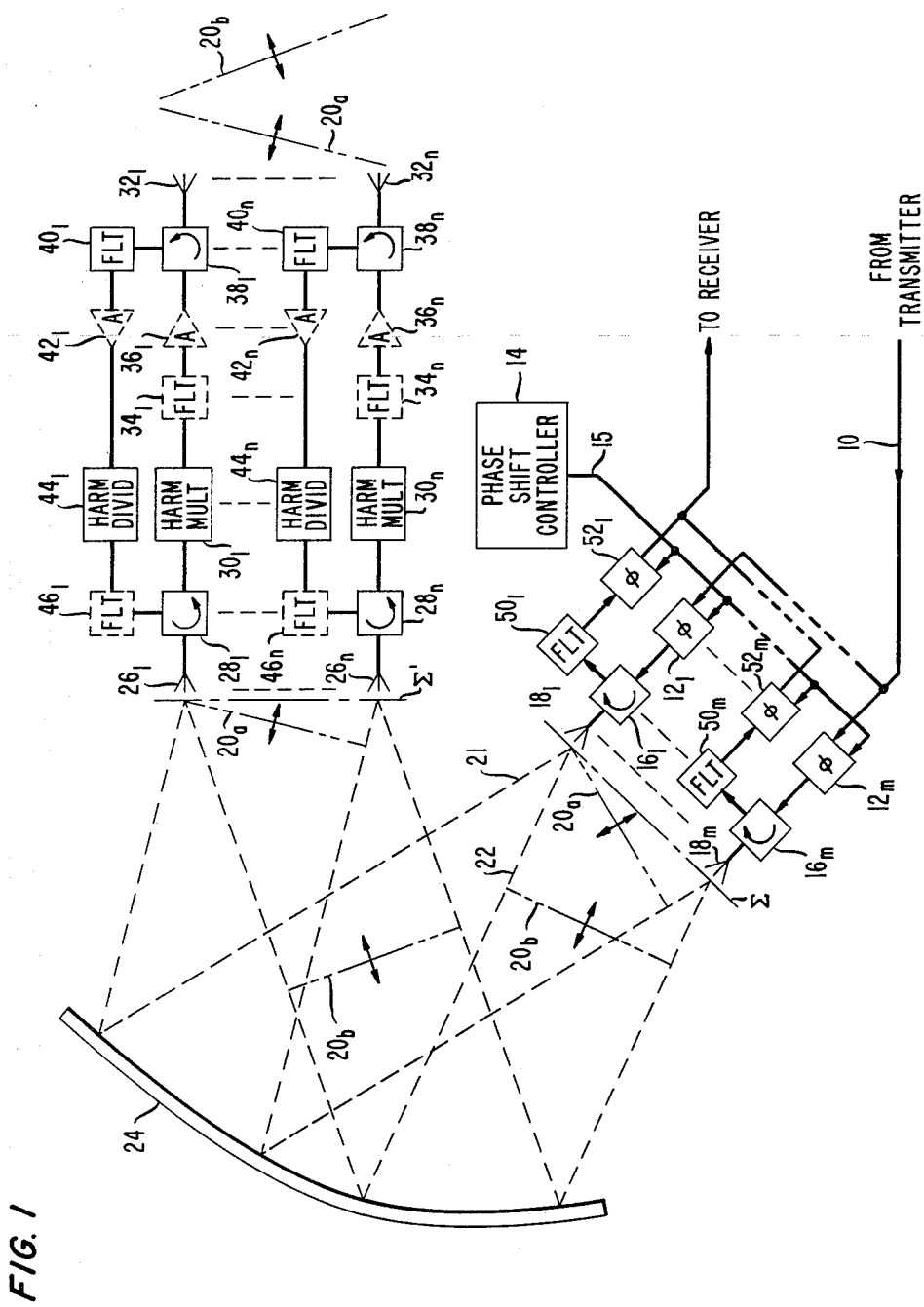
FIG. 1 illustrates a preferred arrangement for the phased array antenna in accordance with the present invention.

FIG. 1 illustrates a preferred arrangement for a phased array antenna in accordance with the present invention which is capable of launching and/or receiving a spot beam to and/or from any remote location within a predetermined wide field of view of the antenna while using fewer phase shifters than normally used in conventional phased array antennas for launching and/or receiving beams associated with the same predetermined wide field of view. For launching a signal in a spot beam directed at one of many remote receivers within the field of view of the antenna, an input signal which is much lower in frequency than is desired for transmission in the particular directional spot beam to the remote receiver is generated by a transmitter (not shown) for delivery on line 10. The input signal on line 10 is divided into m equal components and each component is applied at an input to a separate one of a plurality of m phase shifters $12_1$–$12_m$.

Phase shifters $12_1$–$12_m$ are each responsive to a separate control signal from a phase shift controller 14 over bus 15 for causing a predetermined phase shift to be introduced in the input signal component propagating therethrough. The output signal from each of phase shifters $12_1$–$12_m$ is directed by a corresponding one of a plurality of m waveguide diplexers or circulators $16_1$–$16_m$ to a corresponding one of a plurality of m feed elements $18_1$–$18_m$ disposed on plane $\Sigma$ and forming a first array. Feed elements $18_1$–$18_m$ cause a planar wavefront, as for example, wavefronts $20_a$ or $20_b$, to be launched in, for example, a directional spot beam 21 or 22, respectively, which direction is dependent on the instantaneous phase shifts introduced in the signal being launched by phase shifters $12_1$–$12_m$.

Beams 21 and 22 of FIG. 1, which will be assumed to be representative of beams which will be directed to each extremity of the field of view of the antenna in the plane of the figure, are reflected by a curved reflector 24 toward a second array comprising a plurality of n feed elements $26_1$–$26_n$, where n>m. Feed elements $26_1$–$26_n$ are disposed on a plane $\Sigma'$ which is the conjugate plane of plane $\Sigma$ such that the image of the first array of feed elements $18_1$–$18_m$, formed on plane $\Sigma'$, is superimposed on the second array of feed elements $26_1$–$26_n$.

The signals in planar wavefronts $20_a$ or $20_b$ at each of feed elements $26_1$–$26_n$, with the associated phase shift, is directed via a corresponding one of a plurality of n waveguide diplexers or circulators $28_1$–$28_n$ to a corresponding one of a plurality of n harmonic multipliers $30_1$–$30_n$. Harmonic multipliers $30_1$–$30_n$ function to effectively upconvert the low frequency signal received at feed elements $26_1$–$26_n$ to the appropriate frequency for launching to the desired remote receiver and to concurrently multiply the phase shifts by the multiplicand. In accordance with the present invention it is desirable that the low frequency signal supplied by the transmitter on line 10 be some subharmonic of the high frequency signal to be launched toward the desired remote receiver. In this manner the low frequency signal can be upconverted to the high frequency signal by any suitable harmonic multiplication means as, for example, arrangements which use techniques similar to that employed in the article "Fractional-Frequency Generators Utilizing Regenerative Modulation" by R. I. Miller in the *Proceedings of the IRE*, Vol. 27, No. 7, July 1939 at pp. 446–457. The use of such harmonic frequency multipliers 30 causes both the frequency and phase shift in a received planar wavefront signal to be similarly multiplied to provide appropriate upconversion and appropriate change in phase shift values so that the transmitted planar wavefront resulting therefrom has the same tilt as the received waveform but at the upconverted frequency.

The output signal from each of harmonic multipliers $30_1$–$30_n$ is applied to a separate one of a plurality of n feed elements $32_1$–$32_n$ of a third array via a separate one of n optional filters $34_1$–$34_n$, n optional amplifiers $36_1$–$36_n$ and n waveguide diplexers or circulators $38_1$–$38_n$. Optional filters $34_1$–$34_n$ can comprise any suitable circuit such as, for example, waveguide stripline or coaxial line filters and can be used if harmonic multiplication means $30_1$–$30_n$ produces frequency components outside the desired frequency band of transmission to avoid interference in the receiving section of FIG. 1 or with other communication systems within the field of view of the present antenna arrangement. Optional amplifiers $36_1$–$36_n$ can comprise any suitable arrangement which can be used if the upconverted signal is not already of sufficient strength for transmission be feed elements $32_1$–$32_n$. The output from feed elements $32_1$–$32_n$ is a planar wavefront $20_a$ or $20_b$ which is within the appropriate frequency band and has a direction toward the desired receiver as determined from the phase shifts originally included in the planar wavefront $20_a$ or $20_b$, respectively, transmitted by feed elements $18_1$–$18_m$ and received at feed elements $26_1$–$26_n$ and then multiplied by harmonic multiplication means $30_1$–$30_n$.

For receiving a planar wavefront, as for example, wavefronts $20_a$ or $20_b$, the wavefront from a remote transmitter is intercepted by each of feed elements $32_1$–$32_n$ of the third array. The intercepted signal at each of feed elements $32_1$–$32_n$ is directed by a separate one of diplexer or circulators $38_1$–$38_n$ through a separate one of a plurality of n filters $40_1$–$40_n$ and optional amplifiers $42_1$–$42_n$ to the input of a separate one of a plurality of n frequency dividing means $44_1$–$44_n$. Filters $40_1$–$40_n$ can comprise any suitable filter and function to only pass the frequency band of the received signals and reject any frequency which may cause interference from the output of harmonic multiplication means $30_1$–$30_n$ that may leak into the receiving path via diplexer or circulators $38_1$–$38_n$. Optional amplifiers $42_1$–$42_n$ can be provided if the received signal has to be amplified before subsequent processing. Frequency dividing means $44_1$–$44_n$ each function to harmonically divide the frequency and phase shift of the signal received from the remote transmitter, which is a high frequency signal, to a sub-multiple low frequency signal in the frequency band of the receiver associated with the present antenna arrangement, which low frequency band is near that of the frequency band of the associated transmitter supplying signals on line 10.

The output signal from each of harmonic frequency dividing means $44_1$–$44_n$ is transmitted via a separate one of a plurality of n optional filters $46_1$–$46_n$ and waveguide diplexer or circulators $28_1$–$28_n$ to the associated one of feed elements $26_1$–$26_n$ for transmission in an associated planar wavefront, as for example, wavefront $20_a$ or $20_b$. Optional filters $46_1$–$46_n$ are used if the output of frequency dividing means $44_1$–$44_n$ generate frequency components which are outside the desired frequency band and are not suppressed by, for example, the waveguide itself so that such frequency components could provide interference with other signals of the system.

The planar wavefront launched by feed elements $26_1$–$26_n$ has the same tilt as the originally received planar wavefront at feed elements $32_1$–$32_n$ and is reflected by reflector 24 and intercepted by feed elements $18_1$–$18_m$ of the first array. The intercepted signal at each of feed elements $18_1$–$18_m$ is directed by the associated one of the m waveguide diplexer or circulators $16_1$–$16_m$ to a separate one of a plurality of m filters $50_1$–$50_m$ which function to pass the frequencies of the receive low-frequency band and reject any frequencies in the low-frequency transmit band which may leak into the receive path at diplexer or circulator means $16_1$–$16_m$. The output from each of filters $50_1$–$50_m$ is applied as an input to a separate one of a plurality of m phase shifting means $52_1$–$52_m$ which are responsive to control signals from phase shift controller 14 to introduce a predetermined phase shift in the signal propagating therethrough to provide the coherent reception at the associated receiver of the signal in a desired planar wavefront incident on feed elements $18_1$–$18_m$.

Figure 2:
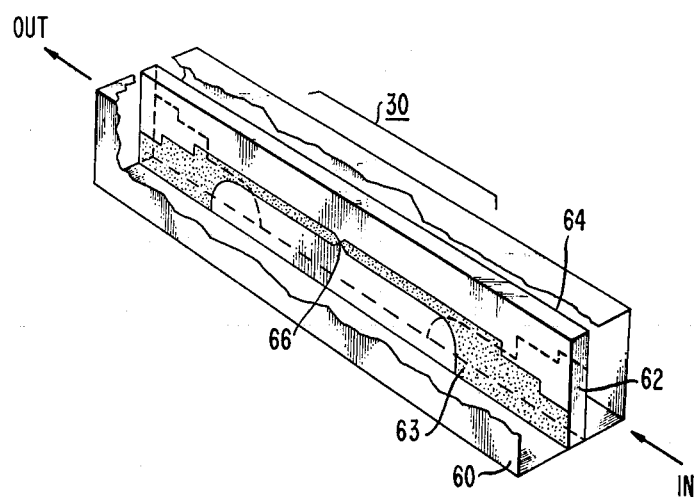
FIG. 2 is a view in perspective of a stripline harmonic multiplication arrangement for use in a waveguide section in the arrangement of FIG. 1.

FIG. 2 illustrates a typical stripline arrangement of an exemplary harmonic multiplication means 30 of FIG. 1 which is disposed within a waveguide section 60. The stripline arrangement is shown as comprising an insulating substrate 62 having deposited on opposing major surfaces thereof a first pattern of conductive material 63 shown by the stippled portion on the nearest surface to a receiver in FIG. 2, and a second pattern of conductive material 64 forming a conductive backing layer within the heavily dashed border lines on the side of substrate 62 furthest from a viewer of FIG. 2. Conductive patterns 63 and 64 are formed with a non-overlapping width starting at opposite edges at each end of substrate 62 and are each stripwise increased in width until pattern 63 covers approximately one-half of the width of substrate 62 where it is gradually reduced in width from the edge to a central conductive lead, and pattern 64 covers the full width of substrate 62. Such configuration provides a smooth transition for a signal entering or leaving the stripline arrangement from or to a waveguide section adjacent each end of the stripline arrangement. In the central area of substrate 62, the conductive leads of pattern 63 are each connected to a separate terminal of a semiconductor diode 66 which produces in a rectified signal, harmonics of that signal. It is known, for example, that diodes can be shaped to produce waveforms which include only one or more predetermined multiples of the input frequency and under such condition an output filter 34 may not be required if only the proper harmonic of the input signal is produced which corresponds to the appropriate high frequency signal.

Figure 3:
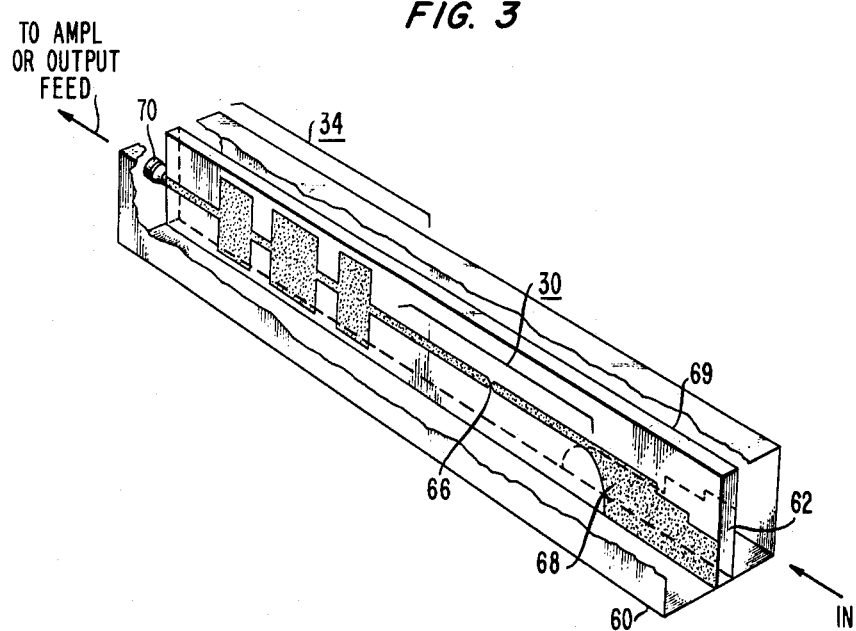
FIG. 3 is a view in perspective of a stripline circuit of a stripline harmonic multiplication and filtering arrangement for use in the arrangement of FIG. 1.

FIG. 3 illustrates a typical stripline arrangement of an exemplary harmonic multiplication means 30 shown in FIGS. 1 and 2 in combination with an exemplary filter 34 which are disposed within a waveguide section 60. As in FIG. 2 a substrate 62 has deposited on major opposing surfaces thereof a first pattern of conductive material 68 shown by the stippled portion on the nearest surface to a viewer of FIG. 3, and a second pattern of conductive material 69 forming a conductive backing layer within the heavily dashed border lines on the side of substrate 62 furthest from a viewer of FIG. 3. At the input end a transition section is shown similar to that of either end of the arrangement of FIG. 2 for improving the transition for a signal entering the stripline arrangement from a waveguide section adjacent the input edge thereof. A signal propagating through the stripline arrangement first encounters a harmonic multiplier section 30 formed from a semiconductor diode 66 and a filter arrangement 34 formed from various widths of conductive material to form, for example, an RC filtering network as is well known in the art. The output of the stripline arrangement is shown terminating in a connector 70 which may be used to connect the stripline arrangement to a coaxial line connected amplifier if desired. It is to be understood that in FIGS. 2 or 3 any suitable connection arrangement at the input or output can be used if a stripline arrangement is employed in the antenna of FIG. 1 for matching connections to the component of the antenna to be connected to such stripline arrangement.

The use of the present arrangement of FIG. 1 permits a lower number of required phase shifters based on the following. The ratio of the scan width to the array beamwidth determines the number of elements and phase shifters required. For a fixed field of view and array size, the number of required phase shifters decreases for lower frequencies because the array beamwidth widens. In FIG. 1, the same scan in beam direction launched by feed elements $18_1$–$18_m$ appears at the image plane $\Sigma'$ and is received by an array with many more elements, which for a two dimensional planar array is equal to a square of the frequency multiplication ratio ($X^2$) between the signals at feed elements 26 and that at feed elements 32. Based on such requirements if the first array of feed elements $18_1$–$18_m$ required 100 feed elements and phase shifters and the required multiplication factor in harmonic multipliers 30 was "4", then each of the second and third arrays would require 1600 feed elements 26 and 32. From this it can be seen that if the signal were to be directly launched by the first array at the appropriate high frequency, normally launched by elements 32, then 1600 feed elements 18 and associated phase shifters 12 or 52 would be required, a much greater number than with the present arrangement. Since frequency multiplication in a harmonic multiplier or mixer also multiplies the phase by the same angle or multiplication factor (X), the output beam at feed elements $32_1$–$32_n$ is tilted at the same angle as received by feed elements $26_1$–$26_n$. It is to be understood that the antenna arrangement of FIG. 1 can be used only as either a receive or a transmit antenna by deleting the unnecessary components associated with the undesired direction of signal propagation and that element 24 can comprise either a focusing reflector or lens.

What is claimed is:

1. A phased array antenna system comprising:

a focusing means (24) comprising a predetermined aperture;

a plurality of m feed elements ($18_1$–$18_m$) disposed to form a first planar array directed at the focusing means; and a plurality of m phase shifters ($12_1$–$12_m$ or $52_1$–$52_m$), each phase shifter being coupled to a separate one of the plurality of m feed elements and capable of introducing a particular separate phase shift to a signal in a first frequency band propagating therethrough in response to a remotely generated control signal to permit a particular directional planar wavefront to be launched or received by the feed elements of the first planar array characterized in that the antenna system further comprises:

a first plurality of n feed elements ($26_1$–$26_n$) forming a second planar array disposed to cover the aperture of, and directed at, the focusing means on the image plane of the first planar array, where m<n;

a second plurality of n feed elements ($32_1$–$32_n$) forming a third planar array comprising a configuration corresponding to the second planar array and covering the aperture of, and directed away from, the focusing means; and a plurality of n harmonic frequency converting means ($30_1$–$30_n$ or $44_1$–$44_n$), each harmonic frequency converting means being disposed in a signal path interconnecting a separate corresponding feed element of the second and third planar arrays for converting the frequency of a signal between a first frequency band normally associated with the signal at the feed element of the second planar array and a harmonic second frequency band which is higher than said first frequency band and normally associated with the signal at the feed element of the third planar array.

2. A phased array antenna system according to claim 1 characterized in that each of the plurality of n harmonic frequency converting means comprises a harmonic frequency multiplication means ($30_1$–$30_n$) which is responsive to a first frequency band signal received at the associated feed element of the second planar array for providing a desired harmonic multiple of said first frequency band signal which lies in the second frequency band for transmission by the associated feed element of the third planar array to a remote location.

3. A phased array antenna system according to claim 1 characterized in that each of the plurality of n harmonic frequency converting means comprises a harmonic frequency dividing means ($44_1$–$44_n$) which is responsive to a second frequency band signal received at the associated feed element of the third planar array for providing a desired harmonic sub-multiple of said second frequency band signal which lies in the first frequency band for transmission by the associated feed element of the second planar array to the feed elements of the first planar array.

4. A phased array antenna system according to claim 1, 2 or 3 characterized in that the harmonic frequency converting means is capable of multiplying the phase shift of a received signal in a planar wavefront at the associated feed elements of either one of the second and third planar arrays by an amount corresponding to the ratio of the frequency of the received signal and the desired frequency of the resultant converted signal which is to be transmitted by the feed elements at the output of said harmonic frequency converting means associated with either one of the second and third planar arrays for maintaining an output planar wavefront at the same tilt as the planar wavefront associated with the received signal.

5. A method of launching a planar wavefront from a phased array antenna system, the method comprising the steps of:

(a) launching a signal in a first frequency band in a predetermined directional planar wavefront from feed elements of a first planar array; and (b) focusing the predetermined directional planar wavefront of step (a) to form an image of the first planar array at an image plane thereof characterized in that the method comprises the further steps of:

(c) intercepting the predetermined directional planar wavefront at feed elements of a second planar array disposed at the image plane;

(d) harmonically multiplying the frequency and phase of the signal received at each feed element of the second planar array by a predetermined number to generate a corresponding signal at a higher second harmonic frequency band; and (e) radiating the resultant signal from step (d) from feed elements of a third planar array, which includes a number of elements and a configuration which corresponds to that of the second planar array, in a planar wavefront having the same tilt and direction as the intercepted planar wavefront of step (c).

6. A method of receiving a planar wavefront at a phased array antenna system, the method comprising the step of:

(a) receiving a signal in a directional planar wavefront from a remote location at feed elements of a first planar array characterized in that the method comprises the further steps of:

(b) harmonically dividing the frequency and phase of the signal received at each feed element of the first planar array by a predetermined number to generate a corresponding signal at a lower second subharmonic frequency of said first frequency band;

(c) radiating the resultant signal from step (b) from feed elements of a second planar array in a predetermined directional planar wavefront including the same tilt and direction as the received planar wavefront of step (a), the first and second planar arrays comprising a corresponding configuration and number of feed elements;

(d) focusing the predetermined directional planar wavefront of step (c) to form an image of the second planar array at an image plane thereof; and (e) intercepting the predetermined directional planar wavefront of step (d) at feed elements of a third planar array disposed at the image plane of the second planar array.

* * * * *